(12) United States Patent
Ishiguro (10) Patent No.: US 7,852,967 B2
(45) Date of Patent: Dec. 14, 2010

(54) AUTOMATIC POWER OUTPUT CONTROL CIRCUIT

(75) Inventor: Kazuhisa Ishiguro, Gunma (JP)

(73) Assignee: Ricoh Co., Ltd., Tokyo (JP)

( * ) Notice: Subject to any disclaimer, the term of this patent is extended or adjusted under 35 U.S.C. 154(b) by 925 days.

(21) Appl. No.: 11/619,306

(22) Filed: Jan. 3, 2007

(65) Prior Publication Data

US 2007/0170988 A1    Jul. 26, 2007

(30) Foreign Application Priority Data

Jan. 12, 2006    (JP) .............................. 2006-004828

(51) Int. Cl.
*H04L 25/03*    (2006.01)
*H04K 1/02*    (2006.01)
*H04L 25/49*    (2006.01)

(52) U.S. Cl. .................... 375/297; 375/295; 455/114.3; 455/522

(58) Field of Classification Search ................. 375/295, 375/297; 455/522, 114.3

See application file for complete search history.

(56) References Cited

U.S. PATENT DOCUMENTS

| 6,169,455 B1 * | 1/2001 | Yamaguchi ................. 330/279 |
| 6,519,293 B1 * | 2/2003 | Miyake ...................... 375/297 |
| 6,526,266 B1 | 2/2003 | Obara |
| 7,082,290 B2 * | 7/2006 | Takano et al. ............... 455/102 |

FOREIGN PATENT DOCUMENTS

| JP | 11-177444 A | 7/1999 |
| JP | 2001-356829 A | 12/2001 |
| JP | 2002-094392 | 3/2002 |
| JP | 2002-280853 | 9/2002 |

* cited by examiner

*Primary Examiner*—Ted M Wang
(74) *Attorney, Agent, or Firm*—Connolly Bove Lodge & Hutz LLP (57) ABSTRACT

This invention includes a gain control section 13 capable of changing an APC loop gain according to a power output level set in a power amplifier to allow suppression of variation in power output level when the power output level is low and suppression of occurrence of ringing when the power output level is high by making the loop gain high when the power output level is low and making the loop gain low when the power output level is high.

1 Claim, 8 Drawing Sheets

AUTOMATIC POWER OUTPUT CONTROL CIRCUIT

BACKGROUND OF THE INVENTION

1. Field of the Invention

The present invention relates to an automatic power control circuit and, more particularly, to one preferably used as an automatic power output control circuit applied to a power amplifier configured to be capable of selecting a desired one of a plurality of power output levels.

2. Description of the Related Art

A conventional radio transceiver uses an automatic power output control circuit (APC (Automatic Power Control) circuit) to keep power radiated from an antenna at the time of transmission constant. The APC circuit controls the intensity of radio waves radiated from the antenna by finely adjusting the gain of a high-frequency power amplifier in an RF (Radio Frequency) circuit section of the radio transceiver (see, e.g., Japanese Patent Laid-Open No. 2002-94392 and Japanese Patent Laid-Open No. 2002-280853).

Some of recent radio transceivers such as a transmitter system are capable of selecting a desired one of a plurality of transmission power output levels and performing communication. However, in each of conventional techniques including those of Japanese Patent Laid-Open No. 2002-94392 and Japanese Patent Laid-Open No. 2002-280853, an APC loop gain is kept constant regardless of power output level.

SUMMARY OF THE INVENTION

However, if an APC loop gain is kept constant in a system capable of selecting one of a plurality of power output levels, the following problems occur. If a low one of a plurality of selectable power output levels is selected, variation in power output level becomes large unless the APC loop gain is considerably high. If the APC loop gain is set to be high for a low power output level, ringing occurs in a signal output from a power amplifier when a high power output level is selected.

The present invention has been made to solve the above-described problems, and has as its object to keep the control characteristic for APC good, regardless of whether a selected power output level is low or high and prevent variation in the power output level of and occurrence of ringing in a signal output from a power amplifier.

In order to solve the problems, the present invention comprises a gain control section which changes a loop gain for automatic power output control according to a power output level set in a power amplifier.

According to the present invention with this structure, if the power output level set in the power amplifier is low, the loop gain for power output control is made high. This suppresses variation in the power output level of a signal output from the power amplifier. On the other hand, if the power output level set in the power amplifier is high, the loop gain for power output control is made low. This suppresses occurrence of ringing in a signal output from the power amplifier. As described above, according to the present invention, it is possible to keep the control characteristic for power output good regardless of whether the selected power output level is low or high and suppress variation in power output level and ringing.

DETAILED DESCRIPTION OF THE PREFERRED EMBODIMENTS

Figure 1:
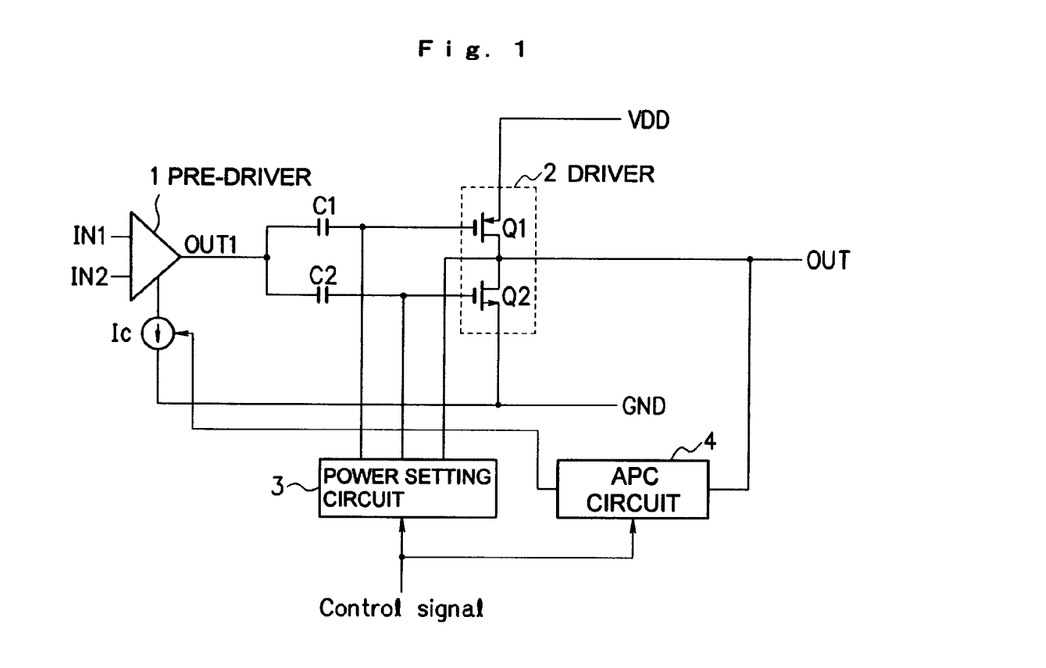
FIG. 1 is a diagram showing an example of the configuration of a power amplifier according to an embodiment.

An embodiment of the present invention will be explained below with reference to the drawings. FIG. 1 is a diagram showing an example of the configuration of a power amplifier according to this embodiment. As shown in FIG. 1, the power amplifier of this embodiment comprises a pre-driver 1 which amplifies the voltage of an input signal to a desired level, a driver 2 which amplifies the power of a signal output from the pre-driver 1 to a desired level, a power setting circuit 3 which sets the power output level (output voltage) of the power amplifier, and an APC circuit 4 which controls the power output level of the power amplifier to be constant at a set level.

Figure 2:
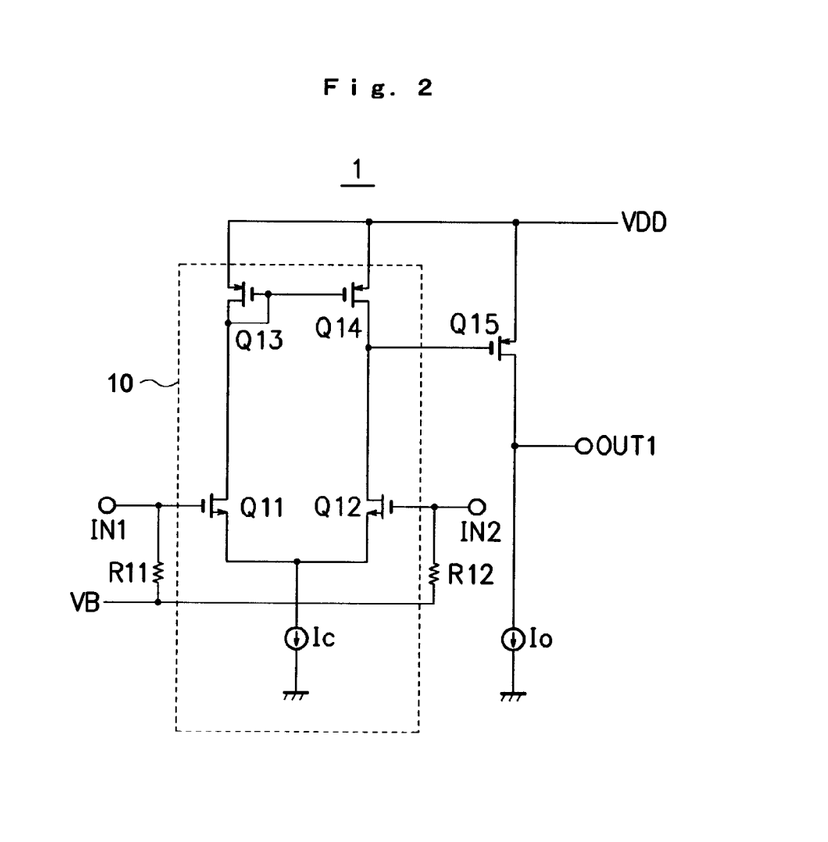
FIG. 2 is a diagram showing an example of the configuration of a pre-driver according to this embodiment.

FIG. 2 is a diagram showing an example of the configuration of the pre-driver 1. In FIG. 2, reference numeral 10 denotes a differential amplifier circuit which comprises a differential pair composed of two transistors Q11 and Q12, transistors Q13 and Q14 constituting a current mirror circuit for taking out, as a single output, outputs from two ends of the differential amplifier circuit 10, and a constant current circuit Ic connected to the differential pair. The one pair of transistors Q11 and Q12 constituting the differential pair has gates connected to two input terminals IN1 and IN2.

Sources of the two transistors Q11 and Q12 are connected to each other, and an end of the constant current circuit Ic is connected to the common source. The other end of the constant current circuit Ic is grounded. Drains of the two transistors Q11 and Q12 are connected to a power supply VDD through the transistors Q13 and Q14, respectively. The transistors Q13 and Q14 are connected to each other in a current mirror configuration.

Reference numerals R11 and R12 denote bias resistors which apply a bias voltage VB to the transistors Q11 and Q12, respectively. Reference numeral Q15 denotes a common source type transistor to whose gate a signal output from the differential amplifier circuit 10 is supplied and which functions as a common source amplifier. The common source amplifier Q15 has a drain connected to a constant current circuit Io and an output terminal OUT1. A source of the common source amplifier Q15 is connected to the power supply VDD.

As described above, the pre-driver 1 of this embodiment has a configuration in which an output from the differential amplifier circuit 10 is taken out as a single output by the common source amplifier Q15.

The driver 2 comprises push-pull output transistors Q1 and Q2 connected to the single output point OUT1 of the pre-driver 1. The first output transistor Q1 is connected between the power supply VDD and an output terminal OUT of the power amplifier while the second output transistor Q2 is connected between the output terminal OUT and ground.

The two output transistors Q1 and Q2 of the driver 2 are connected to the single output point OUT1 of the pre-driver 1 by capacitive coupling through capacitors C1 and C2. That is, the two capacitors C1 and C2 are connected in parallel to the single output point OUT1 of the pre-driver 1, and gates of the output transistors Q1 and Q2 are connected to the capacitors C1 and C2, respectively.

The power setting circuit 3 sets the power output level of the power amplifier in accordance with a control signal supplied from outside (e.g., a microcomputer (not shown)). That is, the power amplifier of this embodiment is configured to be capable of selecting a desired one of a plurality of power output levels with the power setting circuit 3. Switching of the power output level can be implemented by, e.g., making the value of an idling current of the driver 2 variable.

Figure 3:
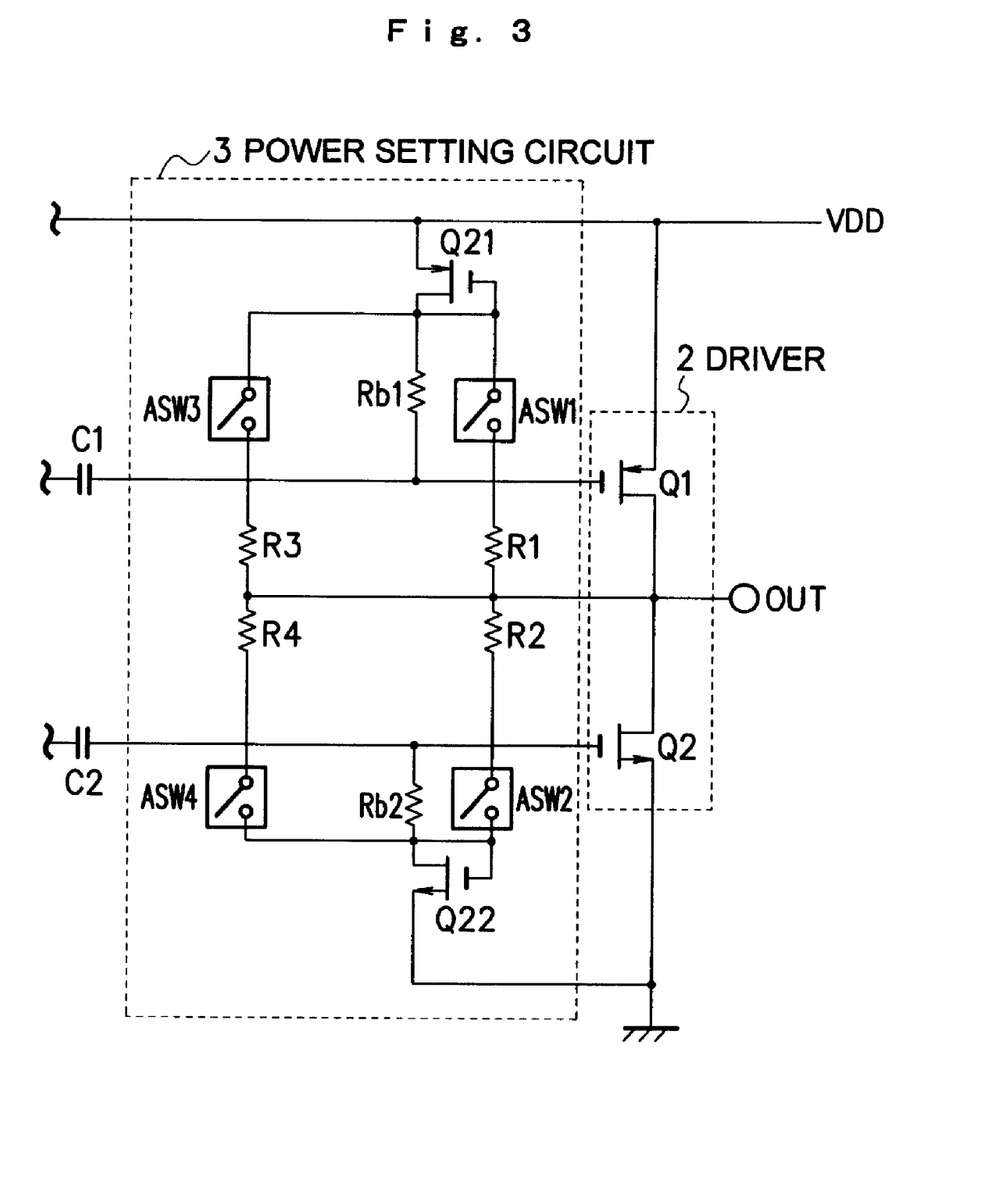
FIG. 3 is a diagram showing an example of the configuration of a power setting circuit according to this embodiment.

FIG. 3 is a diagram showing an example of the configuration of the power setting circuit 3. As shown in FIG. 3, the power setting circuit 3 comprises current setting transistors Q21 and Q22 which are connected to the output transistors Q1 and Q2 of the driver 2, respectively, to have a current mirror relationship, a plurality of current setting resistors R1 to R4, a plurality of analog switches ASW1 to ASW4 for respectively selecting the plurality of current setting resistors R1 to R4, and resistors Rb1 and Rb2 of high resistance which are connected between the gates of the output transistors Q1 and Q2 and gates of the current setting transistors Q21 and Q22, respectively.

More specifically, the first current setting transistor Q21 has a drain connected to the gate thereof. The first current setting transistor Q21 has a source connected to the power supply VDD, and the drain thereof is connected to the gate of the first output transistor Q1 through the first resistor Rb1. The second current setting transistor Q22 has a drain connected to the gate thereof. The second current setting transistor Q22 has a source connected to ground, and the drain thereof is connected to the gate of the second output transistor Q2 through the second resistor Rb2.

The gate of the first current setting transistor Q21 and that of the second current setting transistor Q22 are connected to each other through a series circuit which is composed of the first analog switch ASW1, first and second current setting resistors R1 and R2, and second analog switch ASW2. The gate of the first current setting transistor Q21 and that of the second current setting transistor Q22 are also connected to each other through a series circuit which is composed of the third analog switch ASW3, third and fourth current setting resistors R3 and R4, and fourth analog switch ASW4.

In other words, a first series circuit that is composed of the first analog switch ASW1, first and second current setting resistors R1 and R2, and second analog switch ASW2 and a second series circuit that is composed of the third analog switch ASW3, third and fourth current setting resistors R3 and R4, and fourth analog switch ASW4 are connected in parallel between the gate of the first current setting transistor Q21 and that of the second current setting transistor Q22.

The first resistor Rb1 is connected between the gate of the first output transistor Q1 and that of the first current setting transistor Q21, and the second resistor Rb2 is connected between the gate of the second output transistor Q2 and that of the second current setting transistor Q22. The output terminal OUT of the power amplifier is connected between the two output transistors Q1 and Q2 as described above, between the first and second current setting resistors R1 and R2, and between the third and fourth current setting resistors R3 and R4.

The power setting circuit 3 switches the selection state of each of the analog switches ASW1 to ASW4 in accordance with a control signal supplied from outside, thereby setting the value of the idling current to correspond to a selected power output level. The example in FIG. 3 shows a case where it is possible to select one of two power output levels. For example, if a first power output level of the two power output levels is selected, the first and second analog switches ASW1 and ASW2 are turned on, and the third and fourth analog switches ASW3 and ASW4 are turned off. At this time, the value of the idling current of the driver 2 is determined by the current setting transistors Q21 and Q22 and current setting resistors R1 and R2.

In other words, drain currents Id3 and Id4 of the current setting transistors Q21 and Q22 are given by Formula 1 below.

$$Id3 = Id4 = \frac{VDD - Vgs3 - Vgs4}{R1 + R2} \quad \text{(Formula 1)}$$

Assume that the on resistances of the analog switches ASW1 to ASW4 are sufficiently lower than the resistance values of the current setting resistors R1 and R2. In Formula 1, Vgs3 represents a gate-source voltage of the first current setting transistor Q21, and Vgs4 represents a gate-source voltage of the second current setting transistor Q22. The idling current having a value determined by the aspect ratios of the current setting transistors Q21 and Q22 flows to the output transistors Q1 and Q2 of the driver 2. For this reason, the value of the idling current of the driver 2 when the first power output level is selected depends on the gate-source voltages Vgs3 and Vgs4 of the current setting transistors Q21 and Q22 and the resistance values of the current setting resistors R1 and R2.

On the other hand, if a second power output level is selected, the first and second analog switches ASW1 and ASW2 are turned off, and the third and fourth analog switches ASW3 and ASW4 are turned on. At this time, the value of the idling current of the driver 2 is determined by the current setting transistors Q21 and Q22 and current setting resistors R3 and R4. That is, the drain currents Id3 and Id4 of the current setting transistors Q21 and Q22 are given by Formula 2 below.

$$Id3 = Id4 = \frac{VDD - Vgs3 - Vgs4}{R3 + R4} \quad \text{(Formula 2)}$$

The idling current having a value determined by the aspect ratios of the current setting transistors Q21 and Q22 flows to the output transistors Q1 and Q2. For this reason, the value of the idling current of the driver 2 when the second power output level is selected depends on the gate-source voltages Vgs3 and Vgs4 of the current setting transistors Q21 and Q22 and the resistance values of the current setting resistors R3 and R4.

As described above, the power setting circuit 3 can change the value of the idling current of the driver 2 by switching the selection state of each of the analog switches ASW1 to ASW4 in accordance with a control signal supplied from outside and is configured to be capable of selecting one of power output levels for the driver 2. Note that although the configuration capable of selecting one of two power output levels is shown in this example, it is merely an example. A configuration capable of selecting one of n (n is an integer not less than 2) power output levels has n series circuits connected in parallel, each of which is composed of an analog switch and a current setting resistor.

The APC circuit 4 is a circuit which controls the power output level of the power amplifier to be constant at a desired value set by the power setting circuit 3 if the power output level changes due to variation between devices or environmental changes. That is, the APC circuit 4 detects the output voltage (power output level) of the driver 2 and controls a common current of the constant current circuit Ic of the pre-driver 1 according to a difference between the detected output voltage and a reference voltage. Note that the method for controlling the common current of the constant current circuit Ic of the pre-driver 1 is merely an example and that any other method may be used.

The APC circuit 4 of this embodiment comprises a gain control section which changes the loop gain for automatic power output control (APC) according to the power output level set by the power setting circuit 3. If the set power output level is low, the APC loop gain is made high. On the other hand, if the set power output level is high, the APC loop gain is made low.

Figure 4:
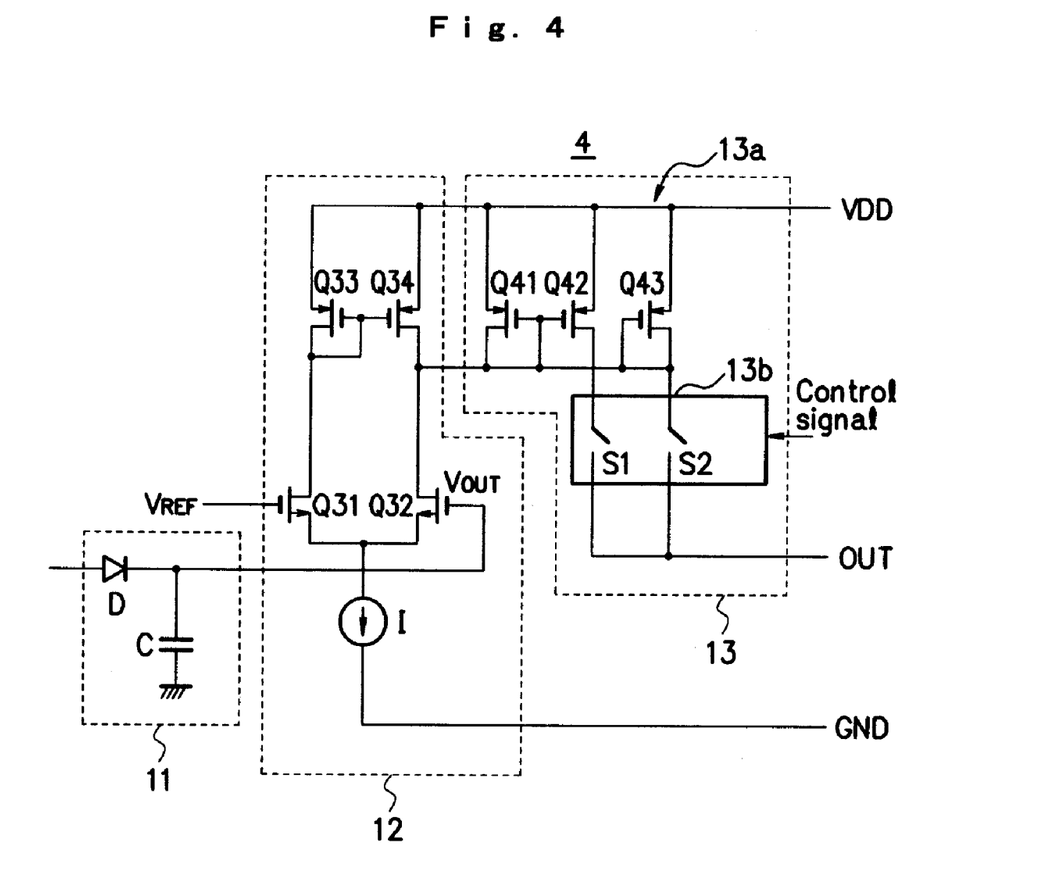
FIG. 4 is a diagram showing an example of the configuration of an APC circuit according to this embodiment.

FIG. 4 is a diagram showing an example of the configuration of the APC circuit 4. As shown in FIG. 4, the APC circuit 4 of this embodiment comprises an output voltage detection section 11, a comparator 12, and a gain control section 13. The output voltage detection section 11 is a detection circuit which detects an output voltage (power output level) $V_{OUT}$ of the power amplifier and comprises a rectifier diode D and a capacitor C.

The comparator 12 compares the output voltage $V_{OUT}$ detected by the output voltage detection section 11 with a reference voltage $V_{REF}$ and performs differential amplification operation on the basis of a difference between the output voltage $V_{OUT}$ and the reference voltage $V_{REF}$. The comparator 12 comprises a differential pair composed of two transistors Q31 and Q32, transistors Q33 and Q34 constituting a current mirror circuit for taking out, as a single output, the difference between the output voltage $V_{OUT}$ and the reference voltage $V_{REF}$ from two ends, and a constant current circuit I which is connected to the differential pair.

The output voltage $V_{OUT}$ and reference voltage $V_{REF}$ are input to gates of the one pair of transistors Q31 and Q32 constituting the differential pair, respectively. Sources of the two transistors Q31 and Q32 are connected to each other, and an end of the constant current circuit I is connected to the common source. The other end of the constant current circuit I is grounded. Drains of the two transistors Q31 and Q32 are connected to the power supply VDD through the transistors Q33 and Q34, respectively. The transistors Q33 and Q34 are connected to each other in a current mirror configuration.

The gain control section 13 can change the gain of the comparator 12 according to the power output level set in the power amplifier. More specifically, the gain control section 13 comprises a current mirror circuit 13a which is connected to the output of the comparator 12 and a selection circuit 13b. The current mirror circuit 13a has a configuration in which each of a plurality of transistors Q42 and Q43 having different sizes is current-mirror connected to a transistor Q41 which is connected to the output of the comparator 12. The selection circuit 13b comprises switches S1 and S2 for respectively selecting outputs from the plurality of transistors Q42 and Q43 having the different sizes.

In the APC circuit 4 shown in FIG. 4, an APC loop gain can be changed by switching the selection state of each of the switches S1 and S2 in accordance with a control signal supplied from outside. For example, if the control signal has a value of "00," as in Table 1 below, the power output level is set to P1 by the power setting circuit 3, the switch S1 of the APC circuit 4 is turned on (the other switch S2 is turned off), and the APC gain is set to G1. On the other hand, if the control signal has a value of "01," the power output level is set to P2 by the power setting circuit 3, the switch S2 of the APC circuit 4 is turned on (the other switch S1 is turned off), and the loop gain is set to G2. Assuming that the size of the transistor Q42 is smaller than that of the transistor Q43, G1<G2 holds. At this time, the power output level P1 is higher than the power output level P2.

TABLE 1

| Control signal | Power | APC gain |
|---|---|---|
| 00 | P1 | G1 |
| 01 | P2 | G2 |

FIGS. 5A to 5E are graphs comparatively showing the control characteristics of cases where the APC circuit 4 of this embodiment is used, and an APC loop gain is controlled and the control characteristics of cases where a conventional APC circuit is used, and an APC loop gain is not controlled.

Figure 5A:
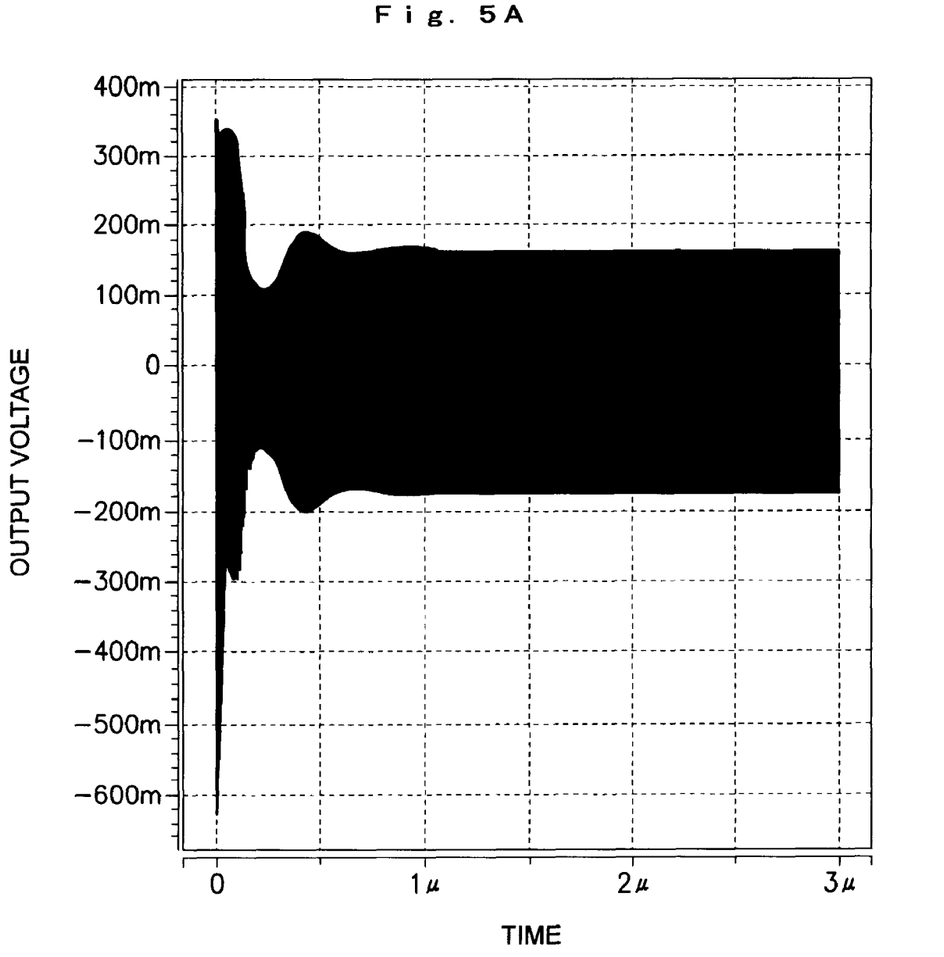
FIG. 5A is a graph showing the control characteristic when a set power output level is low, and there is no variation between devices.
Figure 5B:
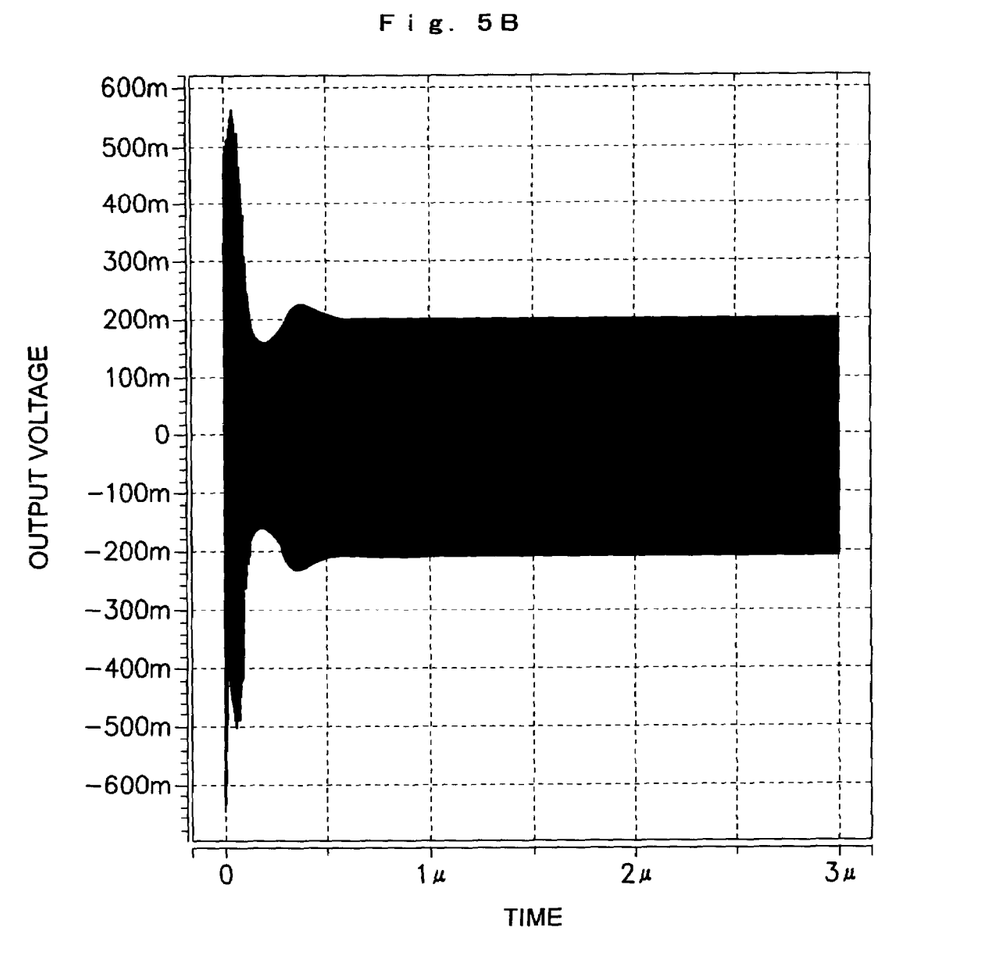
FIG. 5B is a graph showing the control characteristic of this embodiment when a set power output level is low, and there is variation between devices.
Figure 5C:
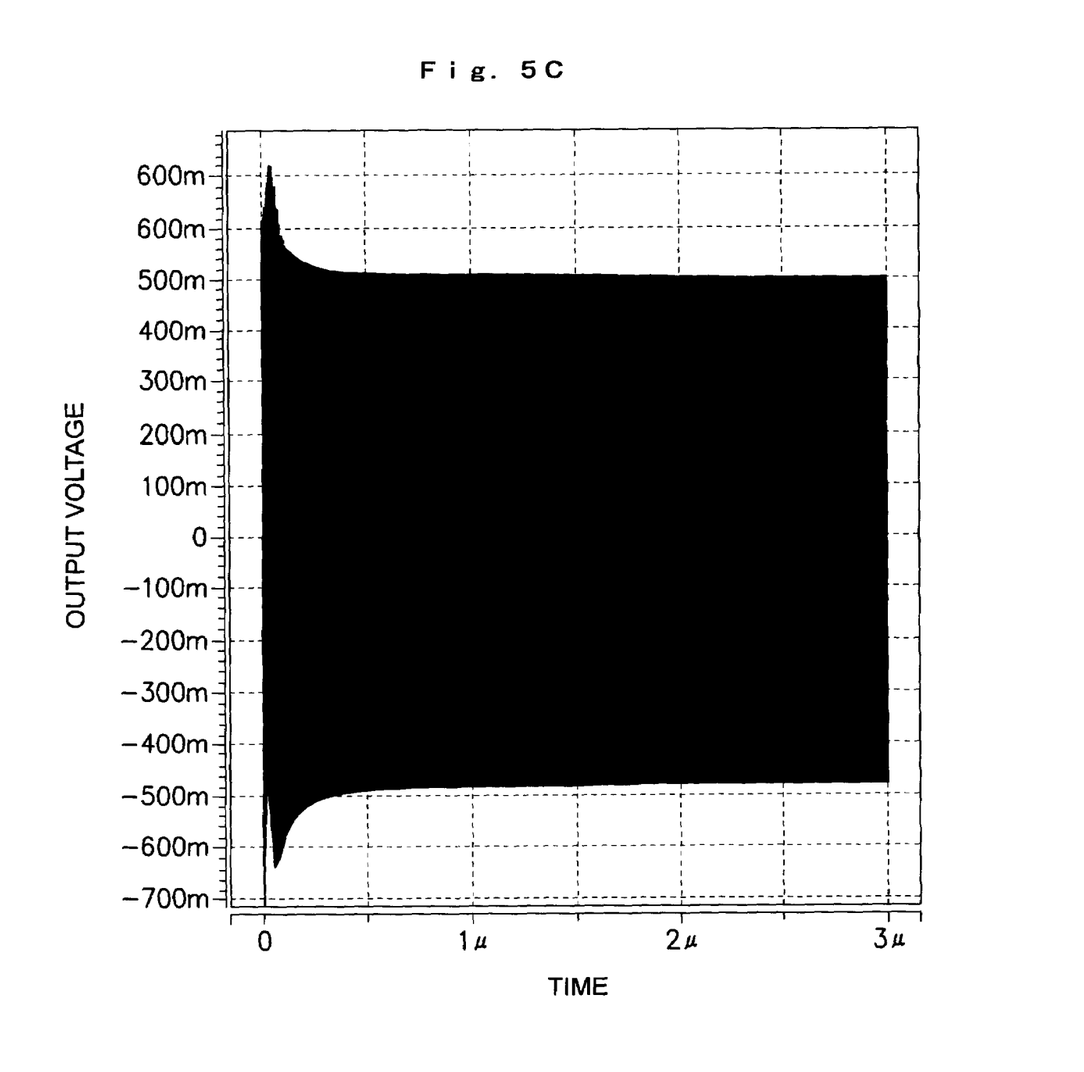
FIG. 5C is a graph showing the control characteristic of a conventional case when a set power output level is low, and there is variation between devices.

The control characteristics shown in FIGS. 5A to 5C are ones of signals output from the power amplifier when the set power output level is low. The control characteristic in FIG. 5A is one when there is no variation between devices, and the control characteristics in FIGS. 5B and 5C are ones when there is variation between devices. The control characteristic in FIG. 5B is one when the APC loop gain is made variable using the APC circuit 4 of this embodiment and set to be high. The control characteristic in FIG. 5C is one when the APC loop gain is fixed to be low, as is conventionally done.

The control characteristic of the conventional case shown in FIG. 5C is significantly different from that with no variation between devices shown in FIG. 5A and has large variation in power output level. In contrast, the control characteristic of this embodiment shown in FIG. 5B is almost identical to that with no variation between devices shown in FIG. 5A. It is apparent from FIG. 5B that variation in power output level can be suppressed.

Figure 5D:
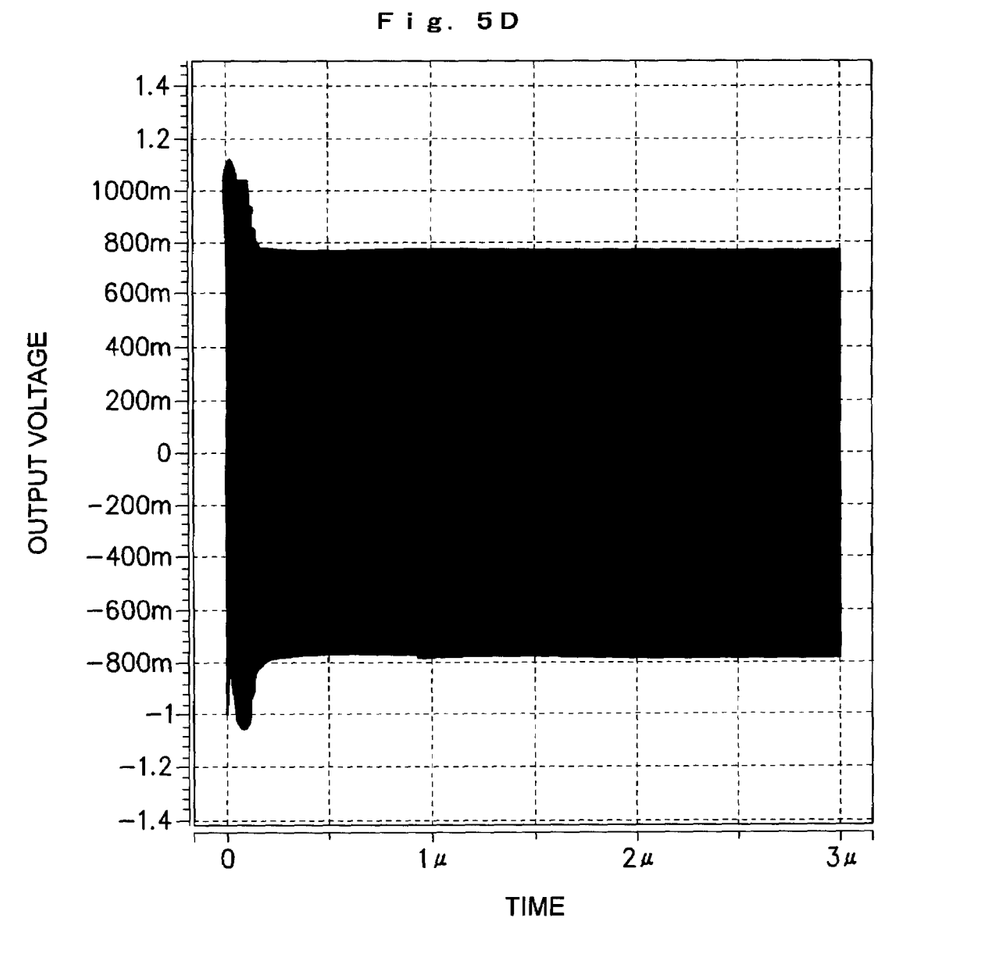
FIG. 5D is a graph showing the control characteristic of this embodiment when the set power output level is high, and there is variation between devices.
Figure 5E:
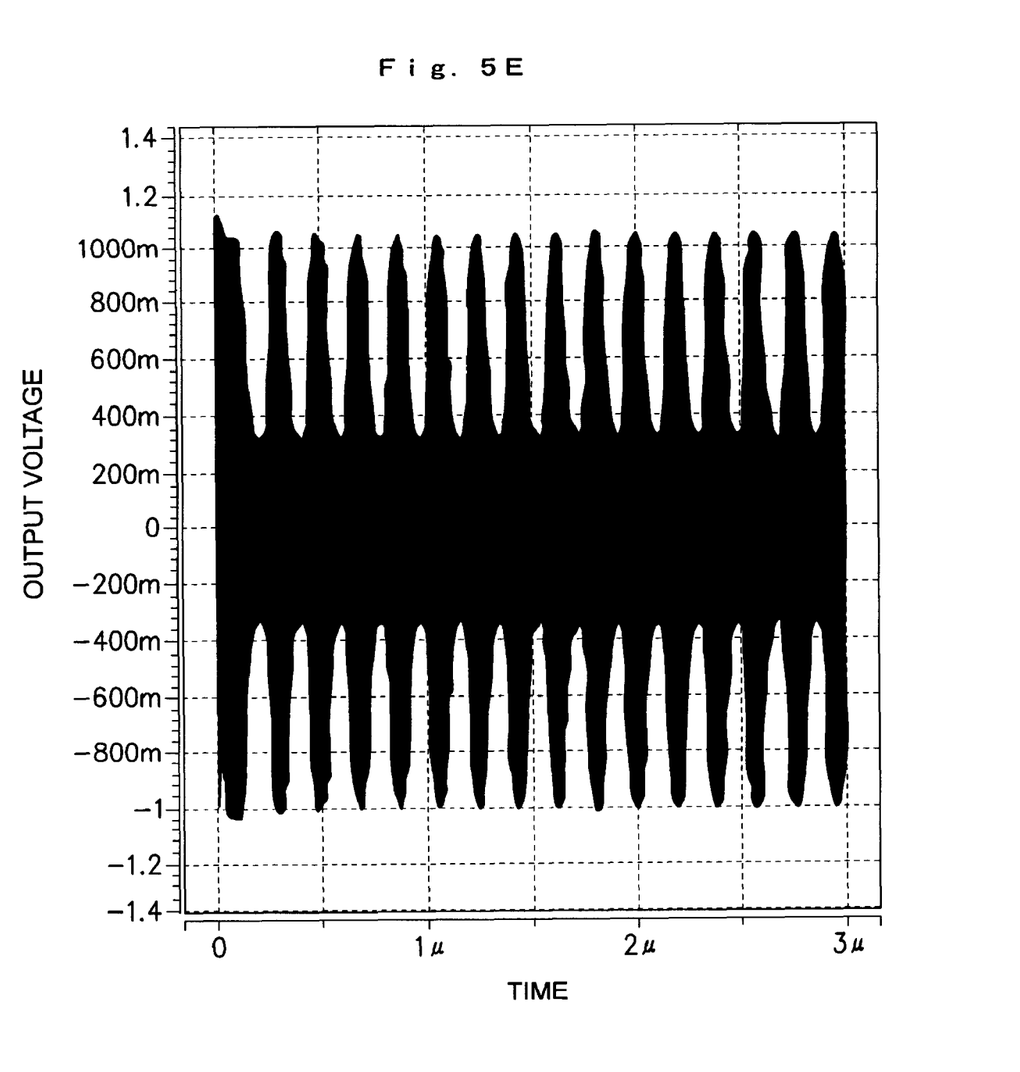
FIG. 5E is a graph showing the control characteristic of the conventional case when the set power output level is high, and there is variation between devices.

The control characteristics shown in FIGS. 5D and 5E are ones when the set power output level is high, and there is variation between devices. The control characteristic in FIG. 5D is one when the APC loop gain is made variable using the APC circuit 4 of this embodiment and set to be low. The control characteristic in FIG. 5E is one when the APC loop gain is fixed to be high, as is conventionally done. There is significant ringing in the control characteristic of the conventional case shown in FIG. 5E. In contrast, it is apparent from FIG. 5D that there is almost no ringing in the control characteristic of this embodiment.

As has been explained in detail above, in this embodiment, the APC loop gain can be changed according to the power output level set in the power amplifier, and the loop gain is made high when the power output level is low and made low when the power output level is high. This makes it possible to suppress variation in power output level when the power output level is low and occurrence of ringing when the power output level is high. Accordingly, the control characteristic for the power output can be kept good, regardless of whether the selected power output level is low or high.

Note that the above-described embodiment is merely a specific example for carrying out the present invention and that the technical scope of the present invention should not be limitedly interpreted. That is, the present invention can be carried out in various forms without departing from the spirit or main features of the present invention.

What is claimed is:

1. An automatic power output control circuit applied to a power amplifier capable of changing a setting of a power output level by changing an idling current of a driver, comprising:

a gain control section which changes a loop gain for automatic power output control according to the power output level set in the power amplifier;

an output voltage detection section which detects an output voltage of the power amplifier; and a comparator which compares the output voltage detected by the output voltage detection section with a reference voltage and performs differential amplification operation on the basis of a difference between the output voltage and the reference voltage, wherein the gain control section comprises a circuit capable of changing a gain of the comparator according to the power output level set in the power amplifier and comprising a current mirror circuit which is connected to an output of a differential amplifier circuit of the comparator and in which each of a plurality of transistors having different sizes is current-mirror connected to a transistor, and a selection circuit which selects one of outputs of the plurality of transistors having the different sizes.

* * * * *